(12) United States Patent
Sano et al.

(10) Patent No.: US 6,603,148 B1
(45) Date of Patent: Aug. 5, 2003

(54) SEMICONDUCTOR DEVICE

(75) Inventors: Masashi Sano, Kyoto (JP); Nobuaki Suzuki, Kyoto (JP); Shinichi Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/701,239
(22) PCT Filed: Apr. 30, 1999
(86) PCT No.: PCT/JP99/02356

§ 371 (c)(1),
(2), (4) Date: Nov. 27, 2000

(87) PCT Pub. No.: WO99/63594

PCT Pub. Date: Dec. 9, 1999

(30) Foreign Application Priority Data

May 29, 1998 (JP) .......................... 10-149580
May 29, 1998 (JP) .......................... 10-149584
May 29, 1998 (JP) .......................... 10-149585

(51) Int. Cl.$^7$ .......................... H01L 33/00; H01L 23/48
(52) U.S. Cl. .......................... 257/98; 257/95; 257/692; 257/790
(58) Field of Search .............. 257/787, 788, 257/790, 791, 666, 691–692, 18–100, 94, 97, 98, 88

(56) References Cited

U.S. PATENT DOCUMENTS 5,311,060 A * 5/1994 Rostoker et al.
6,051,848 A * 4/2000 Webb
6,274,890 B1 * 8/2001 Oshio et al.

FOREIGN PATENT DOCUMENTS

| JP | 60-189940 | 9/1985 | .......... H01L/21/56 |
| JP | 63-200550 | 8/1988 | .......... H01L/23/48 |
| JP | 3-57251 | 3/1991 | .......... H01L/23/48 |
| JP | 6-1250021 | 5/1994 | .......... H01L/23/48 |
| JP | 7-169893 | 7/1995 | .......... H01L/23/48 |

* cited by examiner

Primary Examiner—Wael Fahmy Jr.
Assistant Examiner—Dilinh Nguyen
(74) Attorney, Agent, or Firm—Michael D. Bednarek; Shaw Pittman LLP

(57) ABSTRACT

A semiconductor device (A) includes a first lead (4) to which a semiconductor chip (1) is bonded, a second lead (5) connected to the semiconductor chip (1) via a wire (W), and a resin package (2) sealing the semiconductor chip (1) and the wire (W). Of the first and the second leads (4, 5), at least one of inner terminals (4a, 5b) enclosed in the resin package (2) is bent in a direction of a thickness of the resin package (2).

4 Claims, 10 Drawing Sheets

SEMICONDUCTOR DEVICE

TECHNICAL FIELD

The present invention relates to a resin-packaged semiconductor device. More specifically, the present invention relates to a semiconductor device suitably used as surface-mounted on a substrate.

BACKGROUND ART

FIG. 18 and FIG. 19 show a prior art semiconductor device. The illustrated semiconductor device B is constituted as a light emitting device, and comprises a resin package 90, a semiconductor chip 93, a wire W, a first lead 91, and a second lead 92. The first and the second leads 91, 92 respectively include horizontal inner terminals 91a, 91b enclosed within the resin package 90, and outer terminals 91b, 92b exposed outside of the resin package 90. The outer terminals 91b, 92b have respective bottom surface portions 94a, 94b flush with a bottom surface 90b of the resin package 90. The semiconductor chip 93 is a light emitting element for example, and is bonded to the internal terminal 91a and sealed into the resin package 90. The wire W has a first end bonded to an electrode on an upper surface of the semiconductor chip 93 and a second end bonded to the inner terminal 92a, and is sealed into the resin package 90. The resin package 90 is made, for example, of a transparent epoxy resin not mixed with filler, and has an upper surface 90a formed with a lens portion 95 serving as a convex lens.

The semiconductor device B described above has following problems.

First, the wire W can fail if the semiconductor device B is surface-mounted on a substrate by means of a solder re-flow method. More specifically, as shown in FIG. 19, when the semiconductor device B is surface-mounted on a substrate 96, solder paste H is applied to electrode pads 97a, 97b on the substrate 96. Next, semiconductor device B is placed on the substrate 96 so that the bottom surface portions 94a, 94b of the outer terminals 91b, 92b are located on the corresponding electrode pads 97a, 97b. The substrate 96 and the semiconductor device B in this state is brought in a heating furnace and heated. The temperature in the heating furnace is about 240° C. for example. Thus, the applied solder paste H is re-melted. Thereafter, the substrate 96 and the semiconductor device B are taken out of the heating furnace and allowed to cool, so that the solder paste H sets to fix the semiconductor device B onto the substrate 96.

In the series of operations as described above, at the cooling step which follows the re-melting step, the solder paste H becomes solid at a temperature of 183° C. for example, fixing the first and the second leads 91, 92 onto the electrode pads 97a, 97b. However, at this particular point (at the temperature of 183° C.), the resin package 90 is still soft, staying in a thermally expanded state, being in a course of thermal shrinkage with ongoing further decrease in the temperature. This is because the epoxy resin not mixed with filler has a glass transformation temperature of about 120° C., which is lower than the setting temperature of the solder paste H.

If the resin package 90 shrinks after the first and the second leads 91, 92 have been fixed onto the electrode pads 97a, 97b, a shrinking force of the resin package 90 is exerted to the semiconductor chip 93 and the wire W which are connected to the first and the second leads 91, 92 respectively. This can cause the wire W to fail at a location of the bonding.

Secondly, according to the prior art, when light from the semiconductor chip 93 is condensed by the lens portion 95, it is desirable that there is a large space between the lens portion 95 and the semiconductor chip 93 in order to increase light condensing effect. This is because the light emitted from the semiconductor chip 93 advances in a certain diffusing angle. If a longer distance is provided between the semiconductor chip 93 and the lens portion 95, the light reaching the lens portion 95 becomes closer to a beam which is parallel to an optical axis of the lens portion 95.

However, according to the prior art, if the distance between the semiconductor chip 93 and the lens portion 95 is increased by increasing a thickness of the resin in between, then an overall size of the semiconductor device B has to be increased. On the other hand, as shown in FIG. 20, if a height of the inner terminals 91a, 92a in the resin package 90 is decreased, a thickness t of the resin beneath these inner terminals 91a, 92a has to be decreased in a wide range. This sacrifices strength of the resin package 90, making the resin package 90 susceptible to a crack.

DISCLOSURE OF THE INVENTION

It is therefore an object of the present invention to provide a semiconductor device capable of solving or reducing the above described problem in the prior art.

A semiconductor device provided by a the present invention comprises:

a resin package including an upper surface, a bottom surface opposed thereto thickness wise, a first side surface and a second side surface opposed to the first surface widthwise;

a semiconductor chip sealed in the resin package;

a wire sealed in the resin package and including a first end bonded to the semiconductor chip;

a first lead including a first inner terminal entering from the first side surface into the resin package and a first outer terminal connecting to the first inner terminal and exposed to outside of the resin package, the semiconductor chip being bonded to the first inner terminal; and a second lead including a second inner terminal entering from the second side surface into the resin package and a second outer terminal connecting to the second inner terminal and exposed to outside of the resin package, a second end portion of the wire being bonded to the second inner terminal.

According to this semiconductor device, at least one of the first and the second inner terminals is bent in a direction of the thickness of the resin package.

Preferably, the semiconductor chip provides a light emitting element or a light receiving element, and the resin package is capable of transmitting the light.

Preferably, the resin package is made of an epoxy resin.

Preferably, the upper surface of the resin package is provided with a lens portion for condensing light.

Preferably, the first inner terminal is bent, whereby displacing a bonding portion of the semiconductor chip closer to the bottom surface of the resin package than is a location where the first inner terminal enters the resin package in the first side surface.

Preferably, the first inner terminal is provided with a slanted surface facing each of the semiconductor chip and the lens portion and being capable of reflecting light received.

Preferably, the second inner terminal is bent, whereby providing the second inner terminal with a slanted surface facing each of the semiconductor chip and the lens portion and being capable of reflecting light received.

Preferably, the first inner terminal is provided with a recessed surface surrounding the semiconductor chip, facing the upper surface of the resin package and capable of reflecting light received.

Preferably, the recess provided by the recessed surface is filled with a covering material softer than the resin package and capable of transmitting light. Further, the semiconductor chip is covered by the covering material.

Preferably, each of the first and the second inner terminals is bent, whereby displacing the bonding portion of the semiconductor chip closer to the bottom surface of the resin package than is a location where the first inner terminal enters the resin package in the first side surface, and displacing the bonding portion of the second end of the wire closer to the bottom surface of the resin package than is a location where the second inner terminal enters the resin package in the second side surface.

Preferably, each of the first and the second inner terminals has a crank-like shape.

Preferably, each of the first and the second inner terminals is bent, whereby displacing the bonding portion of the semiconductor chip closer to the upper surface of the resin package than is a location where the first inner terminal enters the resin package in the first side surface, and displacing the bonding portion of the second end of the wire closer to the upper surface of the resin package than is a location where the second inner terminal enters the resin package in the second side surface.

Preferably, the semiconductor chip and the wire are entirely covered by a material which is softer than the resin package when heated with the resin package for softening the resin package.

Preferably, each of the first and the second outer terminals has a bottom surface portion extending along the bottom surface of the resin package.

Preferably, the first and the second outer terminals are exposed respectively from the first and the second side surfaces to out side of the resin package.

Preferably, at least one of the first and the second outer terminals is exposed from the bottom surface of the resin package to out side of the resin package.

Other objects, characteristics, and advantages of the present invention will become clearer from the following description of embodiments to be presented with reference to the accompanying drawings.

BEST MODE FOR CARRYING OUT THE INVENTION

Hereinafter, preferred embodiments of the present invention will be described with reference to FIG. 1 to FIG. 16.

Figure 1:
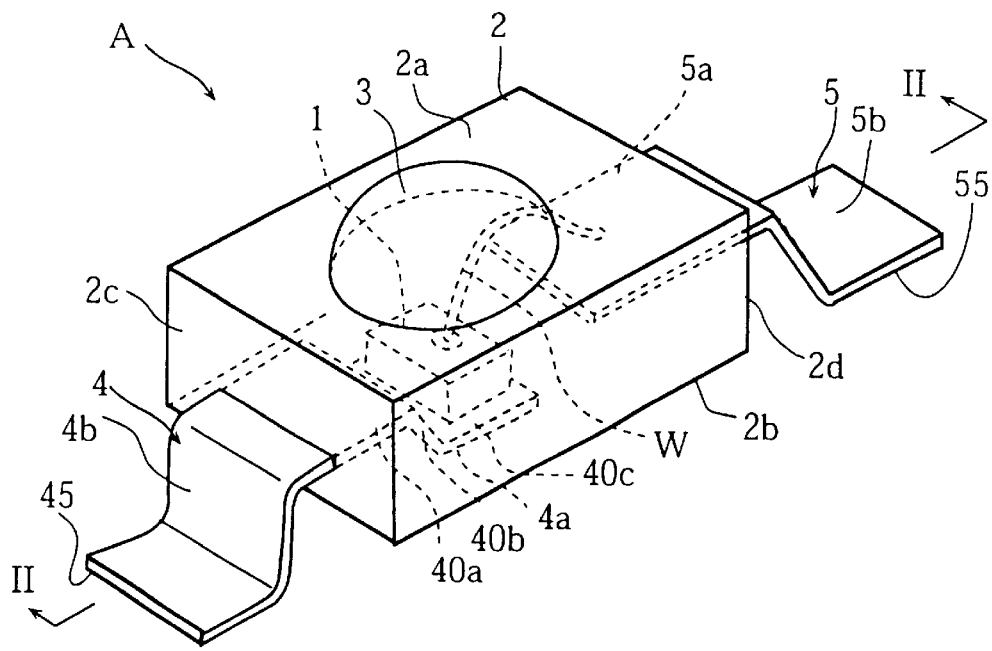
FIG. 1 is a perspective view of a semiconductor device according to a first embodiment of the present invention.
Figure 2:
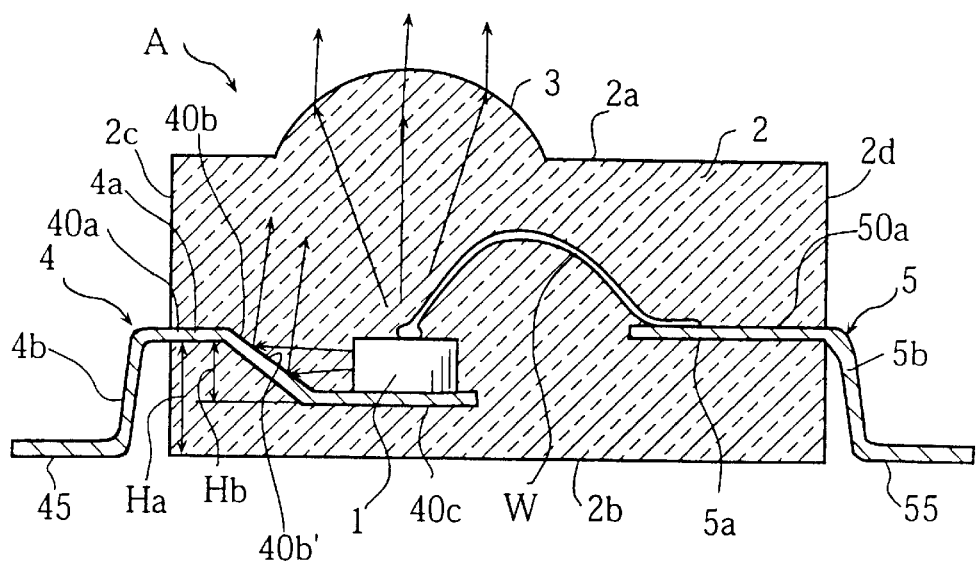
FIG. 2 is a sectional view taken in lines II—II in FIG. 1.

FIG. 1 and FIG. 2 show a semiconductor device A as a first embodiment of the present invention. The semiconductor device A comprises a light emitting element 1 as a semiconductor chip, a wire W, a resin package 2, a first lead 4 and a second lead 5.

The light emitting element 1 can be a light emitting diode for example. The resin package 2 is made for example of an epoxy resin not mixed with filler, and formed generally in a rectangular parallelepiped, enclosing the light emitting element 1 and the wire W. The resin package 2, however, has an upper surface 2a integrally formed with a hemispheric lens portion 3 projecting upward.

The first and the second leads 4, 5 are respectively made of thin plates of a metal such as copper having a predetermined width. The first lead 4 includes a first inner terminal 4a entering into the resin package 2 from a first side surface 2c of the resin package 2, and a first outer terminal 4b extending out of the resin package 2 from the first side surface 2c. The first outer terminal 4b is bent to form a bottom surface portion 45 extending flush with a bottom surface 2b of the resin package 2.

The first inner terminal 4a is also bent. This bending provides the first inner terminal 4a with a horizontal portion 40a near the first side surface 2c, another horizontal portion 40c closer to a center portion of the resin package 2, and a slanted portion 40b between the horizontal portions 40a, 40c. Here, the term horizontal according to the embodiments of the present invention means being in parallel to the bottom surface 2b of the resin package 2. A relatively large dimension is given as a height Ha from the bottom surface 2b of the resin package 2 to the horizontal portion 40a. The horizontal portion 40c has an upper surface on which the light emitting element 1 is bonded at a location right beneath the lens portion 3. The slanted portion 40b is slanted so as to position the horizontal portion 40c lower than the horizontal portion 40a by an appropriate dimension Hb. The slanted portion 40b has an upper surface providing a sloped surface 40b', which faces the lens portion 3 of the resin package 2 and the light emitting element 1 at respective predetermined angles, providing a surface capable of reflecting a light coming to the sloped surface 40b' from the light emitting element 1 toward the lens portion 3. In order to increase light reflection efficiency on the sloped surface 40b', the sloped surface 40b' may be coated with a white film or a glossy film of metal.

The second lead 5 includes a second inner terminal 5a extending into the resin package 2 from a second side surface 2d opposite to the first side surface 2c of the resin package 2, and a second outer terminal 5b extending out of the resin package 2 from the second side surface 2d. The second outer terminal 5b is bent symmetrically to the first outer terminal 4b, to form a bottom surface portion 55 extending flush with the bottom surface 2b of the resin package 2. The second inner terminal 5a is horizontal at the same height with the horizontal portion 40a of the first inner terminal 4a. The wire W has a first end bonded to an electrode on an upper surface of the light emitting element 1, and a second end bonded to a portion of the second inner terminal 5a closer to the center portion of the resin package 2. Thus, the second lead 5 is mechanically and electrically connected to the light emitting element 1 via the wire W.

Figure 4:
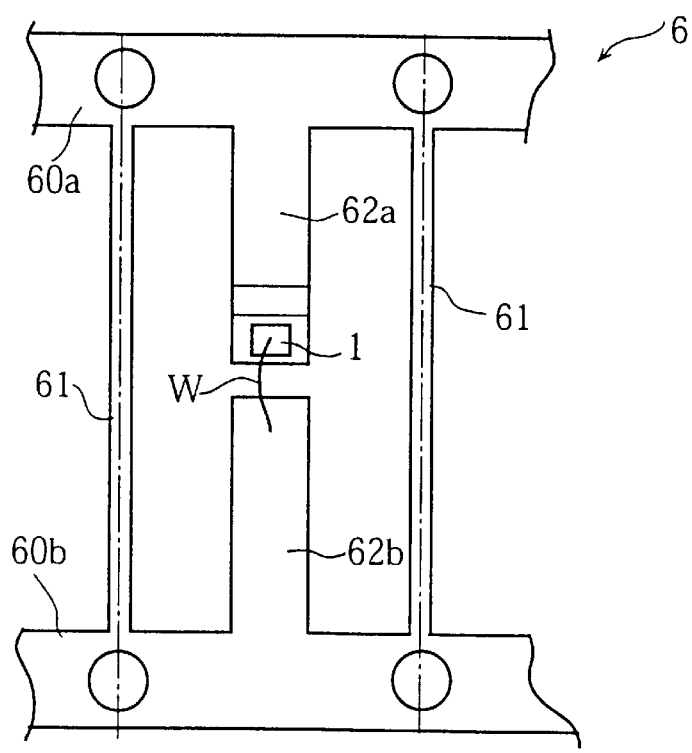
FIG. 4 is a plan view showing a state in which the lead frame in FIG. 3 is mounted with a semiconductor chip and wire bonding is performed.
Figure 5:
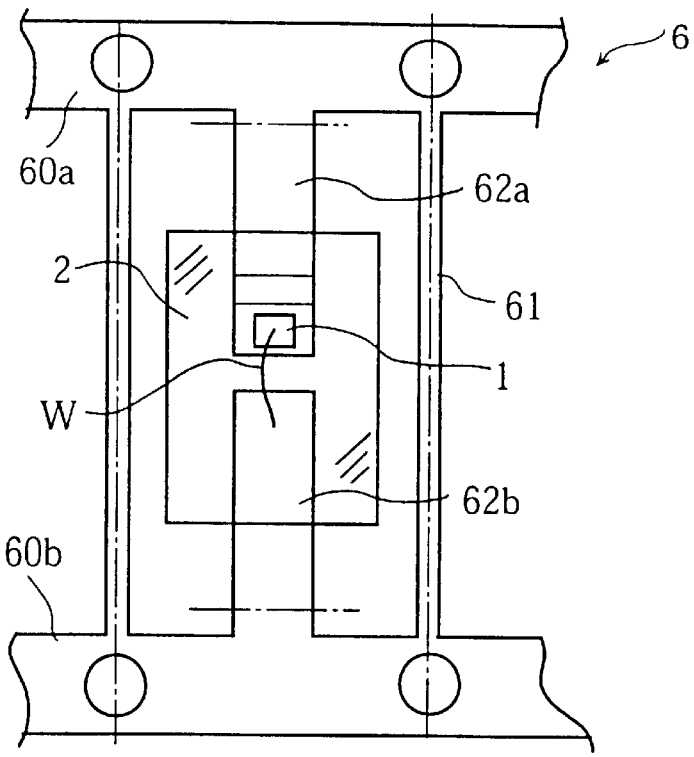
FIG. 5 is a plan view showing a state in which the semiconductor chip and the wire in FIG. 4 are enclosed in a resin package.

Next, a method of manufacturing the semiconductor device A having the above described constitution will be described briefly with reference to FIG. 3 to FIG. 5.

Figure 3:
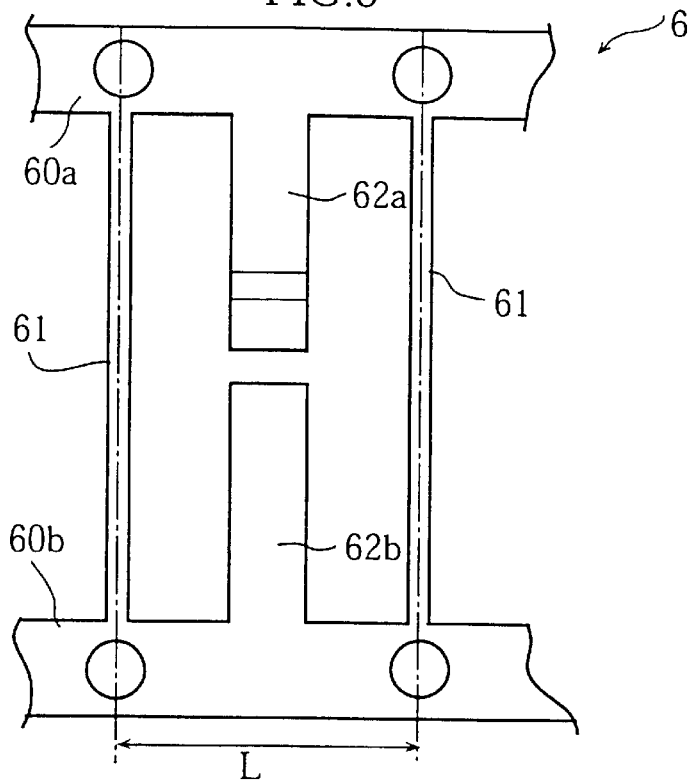
FIG. 3 is a plan view of a lead frame used for manufacture of the semiconductor device in FIG. 1.

For the manufacture of the semiconductor device A, a lead frame 6 as shown in FIG. 3 is used. The lead frame 6, which can be produced by punching out a thin metal plate made of copper for example, includes a pair of side bands 60a, 60b extending in parallel to each other. The side bands 60a, 60b are connected with each other by a plurality of cross members 61 provided at a predetermined interval L. In a region between a pair of mutually adjacent cross members 61, the side bands 60a, 60b are respectively formed with leads 62a, 62b extending toward but spaced from each other. These leads 62a, 62b are portions respectively to become the first and the second leads 4, 5. The lead 62a has an inner end portion already bent into the same shape as the first inner terminal 4a shown in FIG. 2.

After preparing the lead frame 6 as described above, as shown in FIG. 4, light emitting element 1 is bonded to the inner end portion of the lead 62b. Thereafter, ends of the wire W are bonded to the upper surface of the light emitting element 1 and the inner end portion of the lead 62b respectively. Next, as shown in FIG. 5, the resin package 2 is formed to enclose the light emitting element 1 and the wire W. The formation of the resin package 2 can be achieved by means of a transfer molding method for example, and the lens portion 3 can also be formed simultaneously. After the formation of the resin package 2, the leads 62a, 62b are cut off the side bands 60a, 60b (lead cutting step). Finally, the portions of the leads 62, 62b extending out of the resin package 2 are bent (lead forming step), providing a semiconductor device A as shown in FIG. 1.

Next, function of the semiconductor device A will be described.

Figure 6:
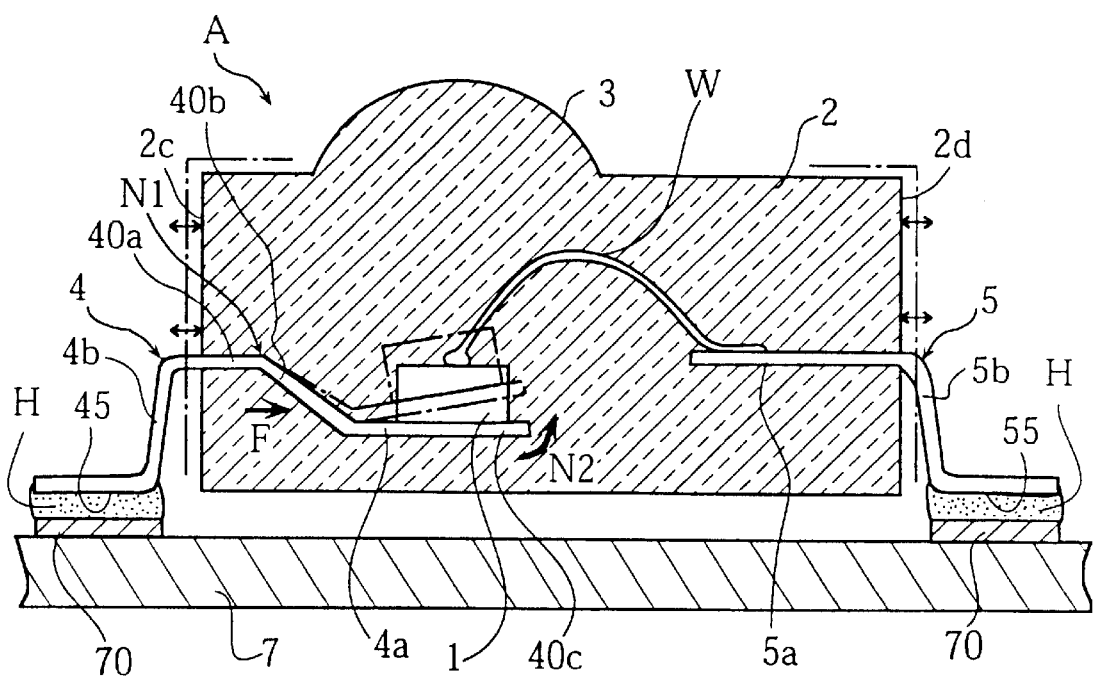
FIG. 6 is a sectional view illustrating function at a time of mounting the semiconductor device according to the first embodiment.

The semiconductor device A is used as mounted on a substrate for example. For the mounting, a solder re-flow method is suitably utilized. According to the solder re-flow method, as shown in FIG. 6, solder paste H is applied in advance to two electrode pads 70 provided in the substrate 7. Next, bottom surfaces 45, 55 of the first and the second outer terminals 4b, 5b are aligned with the two electrode pads 70 respectively. Then, the semiconductor device A is brought into a heating furnace with the substrate 7 for heating. At a temperature of 240° C. for example, the solder paste H is re-melted, and then the semiconductor device A and the substrate 7 are taken out of the heating furnace to allow the solder paste H to cool and set thereby fixing the first and the second leads 4, 5 to the corresponding electrode pads 70.

As has been described earlier, according to the prior art, in the mounting steps of the semiconductor device, the resin package stays soft and continues to thermally shrink even after the outer terminals are fixed to the electrode pads, causing a large stress at the places of wire bonding. On the contrary, in the semiconductor device A according to the present invention, as shown in FIG. 6, when the resin package 2 shrinks to its original state from a thermally expanded state as indicated by phantom lines in the figure, the slanted portion 40b of the first inner terminal 4a provides resistance to the shrinkage of the resin. More specifically, when the resin package 2 shrinks, a force and an action to relatively pull the first lead 4 out of the resin package 2 are generated between the resin package 2 and the first lead 4. The slanted portion 40b reduces this relative action. Especially, the slanted portion 40b prevents the resin closer to the first side surface 2c than to the slanted portion 40 from moving toward the light emitting element 1 and the first end of the wire W. Therefore, it becomes possible to reduce stress acting on the place of bonding on the first end of the wire W.

In addition, when the slanted portion 40b receives a shrinking force F of the resin package 2, it is expected that the first inner terminal 4a rotates about an upper portion (indicated by alpha-numeral N1 in FIG. 6) of the slanted portion 4b in an upward direction as indicated by an arrow N2, taking an attitude as emphatically illustrated in phantom lines. Such a rotation as the above moves the light emitting element 1 toward the second inner terminal 5a. This direction of movement is identical with a direction in which the resin package 2 is shrinking, and at the same time is a direction in which tension in the wire W is reduced. Therefore, these motions also contribute to the elimination of failure of the wire W.

The semiconductor device A according to the present embodiment is used as a light emitting device of an optical sensor for example. As clearly indicated in FIG. 2, when the light emitting element 1 emits light, the light coming from the light emitting element 1 to the lens portion 3 can be refracted by the lens portion 3 into a direction closer to a direction of an optical axis of the lens portion 3. Height of the light emitting element 1 in the resin package 2 is low because of the bent formed in the first inner terminal 4a. Thus, a large distance can be provided between the light emitting element 1 and the lens portion 3. Therefore, the diffusing angle of the light coming from the light emitting element 1 to the lens portion 3 is narrowed, and accordingly the light passing through the lens portion 3 can be condensed closer to the direction of the optical axis of the lens portion 3. As a result, it becomes possible to increase radiation efficiency of the light to a desired region which faces the lens portion 3. The light emitting element 1 emits the light not only upward but also in surrounding directions. Part of the light emitted in the directions around the light emitting element 1 is reflected by the sloped surface 40b' toward the lens portion 3. Therefore, it becomes possible to increase an amount of light coming out of the lens portion 3, thereby further increasing the radiation efficiency of the light to the desired region.

Although the height of the horizontal portion 40c to which the light emitting element 1 is bonded is low, the other portions of the first inner terminal 4a and all of the second inner terminal 5a are positioned at a substantially higher location above the bottom surface 2b of the resin package 2, providing beneath a large thickness of the resin. Therefore, it is possible to assuredly provide strength of the resin package 2. If the semiconductor device A is fixed onto the substrate by using the first and the second outer terminals 4b, 5b, force exerted to the first and second outer terminals 4b, 5b or the resin package 2 tends to act on a point where the first lead 4 meets the resin package 2 on the first side surface 2c, or on a point where the second lead 5 meets the resin package 2 on the second side surface 2d. However, these regions are located especially high above the bottom surface 2b of the resin package 2, with surrounding portions of the resin package 2 having a large thickness. Therefore, the above described force can be controlled not to easily crack the surrounding portions.

According to the present invention, the light emitting element 1 may be replaced by a light receiving element. In this case, the semiconductor device can be constituted as a light receiving device for an optical sensor for example. The light receiving element can be a photodiode or a phototransistor. In such a case as above, the lens portion 3 serves to condense light coming into the lens portion 3 from outside of the resin package 2. Further, the sloped surface 40b' of the first inner terminal 4a serves to reflect the light coming from outside into the resin package 2. Therefore, if the semiconductor device A is constituted as the light receiving device, it becomes possible to increase sensitivity to the light. The fact that the semiconductor chip can be either the light emitting element or the light receiving element applies to all of the other embodiments to be described below.

Figure 7:
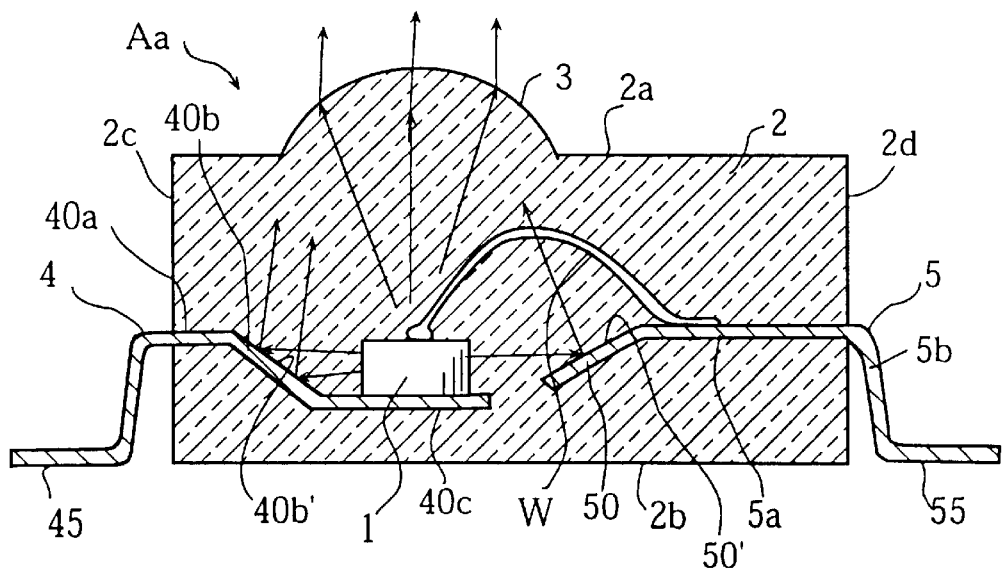
FIG. 7 is a sectional view of a semiconductor device according to a second embodiment of the present invention.

FIG. 7 shows a semiconductor device Aa as a second embodiment of the present invention. It should be noted here that in FIG. 7 and thereafter, elements identical with or similar to those used in the semiconductor device A in the first embodiment are indicated by the same alpha-numeral codes.

As shown in FIG. 7, semiconductor device Aa is provided with a slanted portion 50 in the second inner terminal 5a of the second lead 5. The slanted portion 50 faces each of the light emitting element 1 and the lens portion 3, and has a sloped surface 50' capable of reflecting light.

According to the semiconductor device Aa with the above arrangement, the light from the light emitting element 1 can be reflected by the sloped surfaces 40b' 50b' toward the lens portion 3. Therefore, the amount of the light from the lens portion 3 can be increased.

Figure 8:
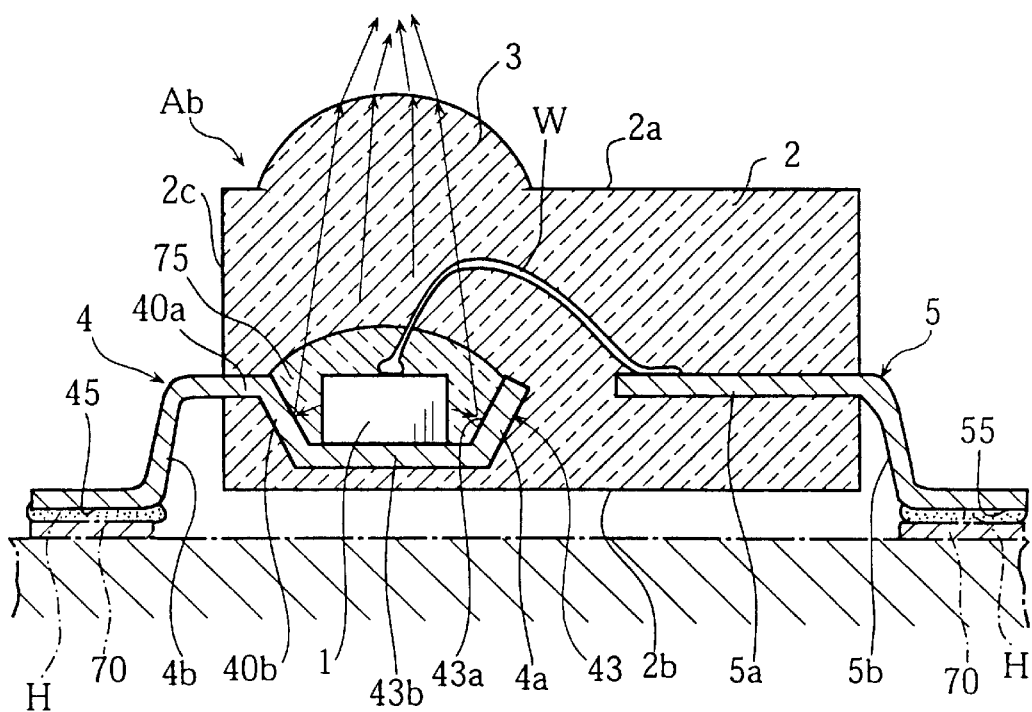
FIG. 8 is a sectional view of a semiconductor device according to a third embodiment of the present invention.
Figure 9:
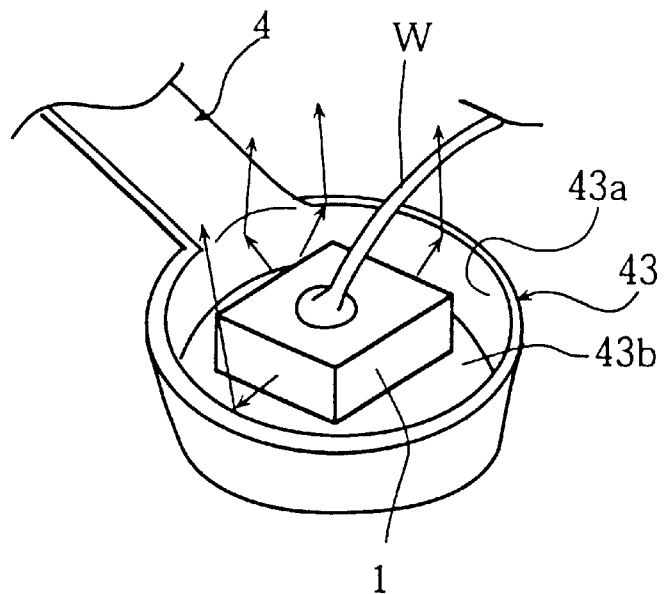
FIG. 9 is a perspective view of a primary portion of the semiconductor device according to the third embodiment.

FIG. 8 and FIG. 9 show a semiconductor device Ab according to a third embodiment of the present invention. According to the semiconductor device Ab, the first inner terminal 4a is formed with a cup portion 43 including a recessed surface 43a facing upward. The cup portion 43 has a bottom portion 43b to which the light emitting element 1 is bonded. The recessed surface 43a can reflect light. The recess of the cup portion 43 is filled with a covering material 75 which is transparent and softer than the resin package 2. The light emitting element 1 is covered by the covering material 75. The covering material 75 can be a silicone resin for example.

According to the semiconductor device Ab with the above arrangement, much of the light emitted in the surrounding directions by the light emitting element 1 can be reflected by the recessed surface 43a efficiently toward the lens portion 3. Therefore, the amount of light from the lens portion 3 can be further increased. Further, since the light emitting element 1 is covered by the covering material 75, if an impact is exerted from outside to the resin package 2, it now becomes possible to prevent such an impact from being transmitted directly to the light emitting element 1, and therefore, to better protect the light emitting element 1. On the other hand, in the first inner terminal 4a, the horizontal portion 40a near the first side surface 2c of the resin package 2 is continuous to the bottom portion 43b of the cup portion 43 via the slanted portion 40b as part of the cup portion 43. The bonding location of the light emitting element 1 is lower than the horizontal portion 40a. This first inner terminal 4a has a basic construction common to that of the semiconductor device A according to the first embodiment described earlier. Therefore, when mounting on the substrate by means of the solder re-flow method, the same effect of preventing the wire from failure as described for the semiconductor device A can be obtained.

Figure 10:
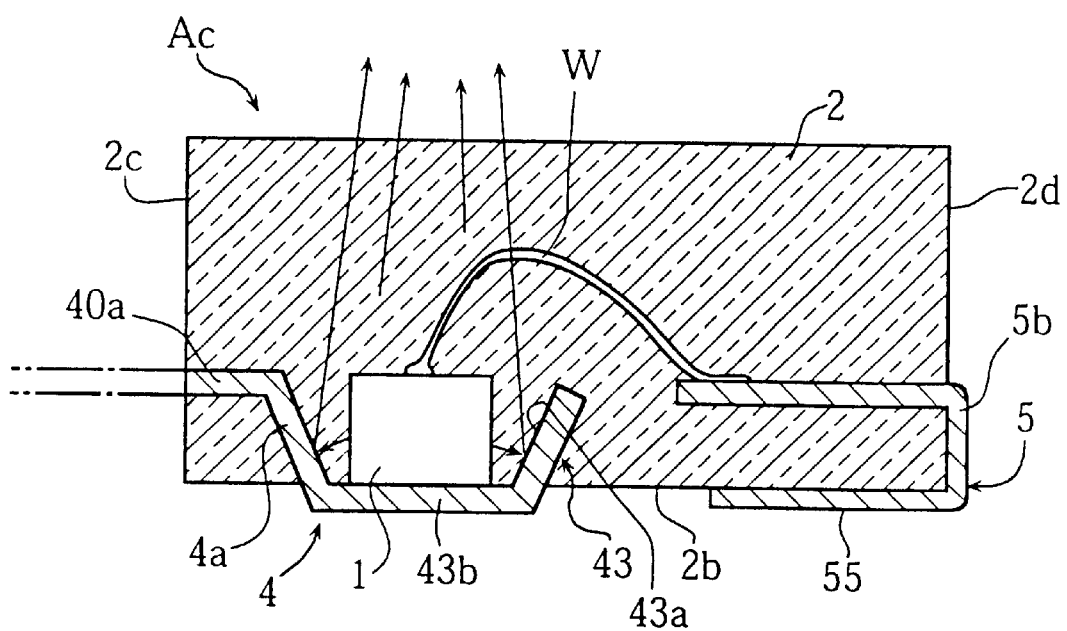
FIG. 10 is a sectional view of a semiconductor device according to a fourth embodiment of the present invention.

FIG. 10 shows a semiconductor device Ac according to a fourth embodiment of the present invention. According to the semiconductor device Ac, the bottom portion 43b of the cup portion 3 provided in the first lead 4 projects out of the bottom surface 2b of the resin package 2 and exposed to outside. Therefore, the bottom portion 43b serves as the outer terminal. In a manufacturing step of the semiconductor device Ac, as shown by phantom lines in FIG. 10, the first lead 4 originally has a portion extending out of a first side surface 2c of the resin package 2. However, this portion is cut on the first side surface 2c and removed. On the other hand, the second outer terminal 5b is bent at the height of the bottom surface 2b of the resin package 2 toward a center portion of the resin package 2, and has a bottom surface portion 55 laid on the bottom surface 2b of the resin package 2.

Figure 11:
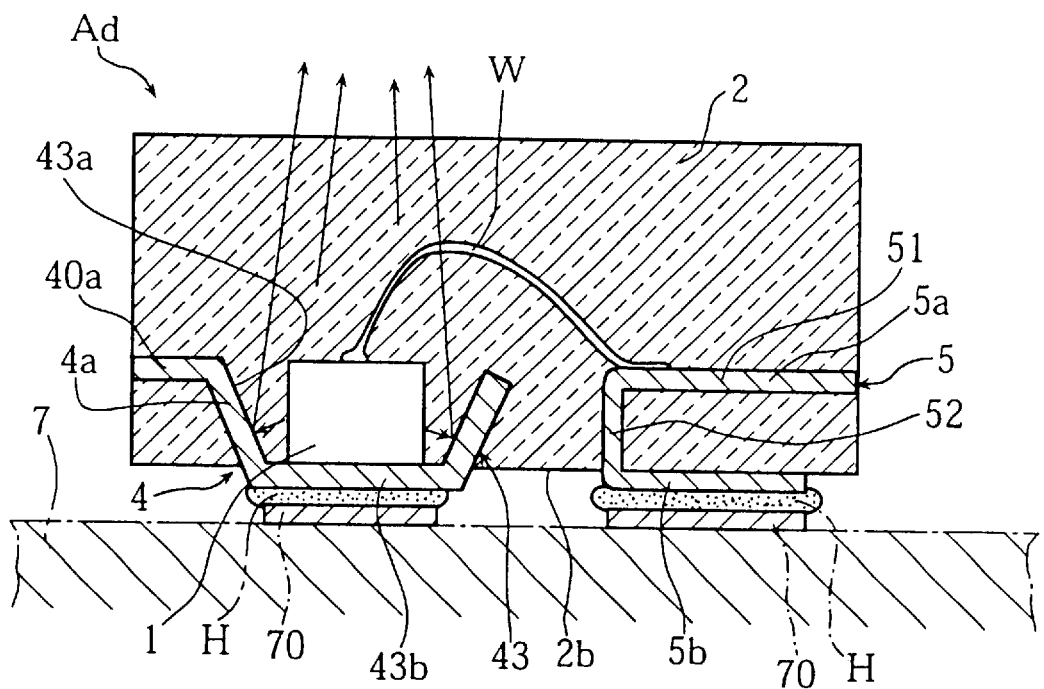
FIG. 11 is a sectional view of a semiconductor device according to a fifth embodiment of the present invention.

FIG. 11 shows a semiconductor device Ad according to a fifth embodiment of the present invention. The semiconductor device Ad is the same as the semiconductor device Ac, differing only in the shape of the second lead 5. More specifically, the second inner terminal 5a of the semiconductor device Ad is bent in a shape of the letter L, having a horizontal portion 51 and a falling portion 52 extending from an inward end of the horizontal portion 51 to the bottom surface 2b of the resin package 2. The second outer terminal 5b is connected to a lower end of the falling portion 52, extending out of the bottom surface 2b of the resin package 2 and is laid on the bottom surface 2b.

According to the semiconductor devices Ac, Ad with respective arrangements described above, in each of the cases, the bottom portion 43b of the cup portion 43 is directly used as the outer terminal, making easy to form the first lead 4 at the time of the manufacture. Further, none of the first and the second leads 4, 5 projects out of the resin package 2 widthwise, making possible to make small the overall width of the semiconductor devices Ac, Ad. Further, the resin package 2 may be thin-walled so as to expose the bottom surface 43b of the cup portion to outside. Thus, it also becomes possible to reduce an overall thickness of the semiconductor devices Ac, Ad.

Figure 12:
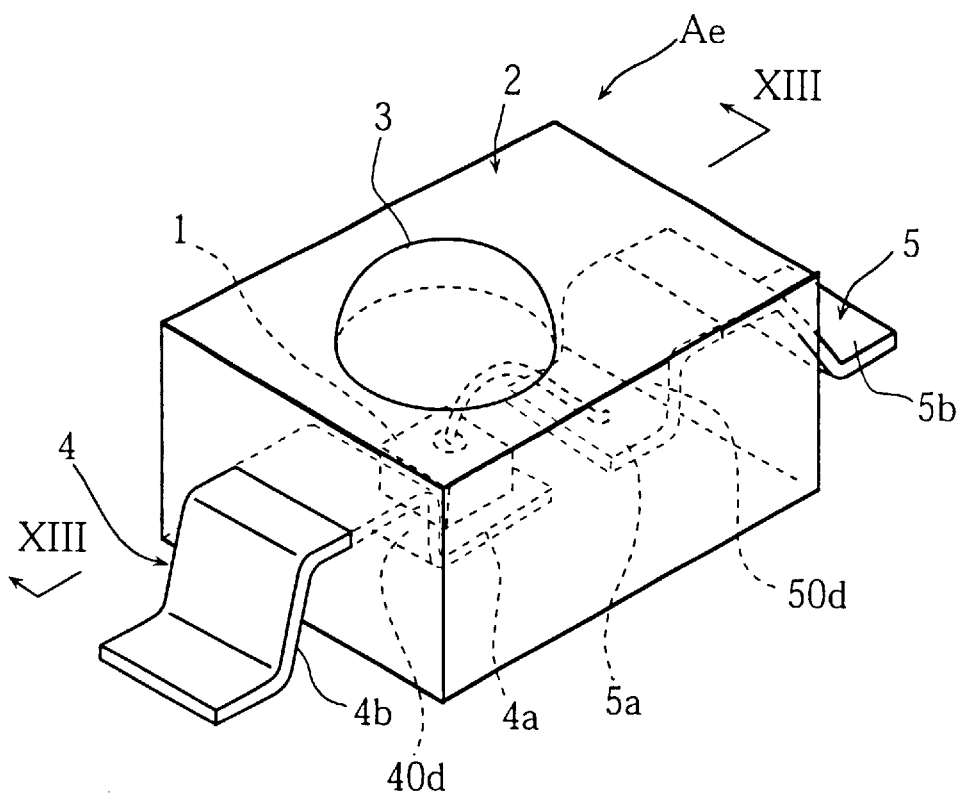
FIG. 12 is a perspective view of a semiconductor device according to a sixth embodiment of the present invention.
Figure 13:
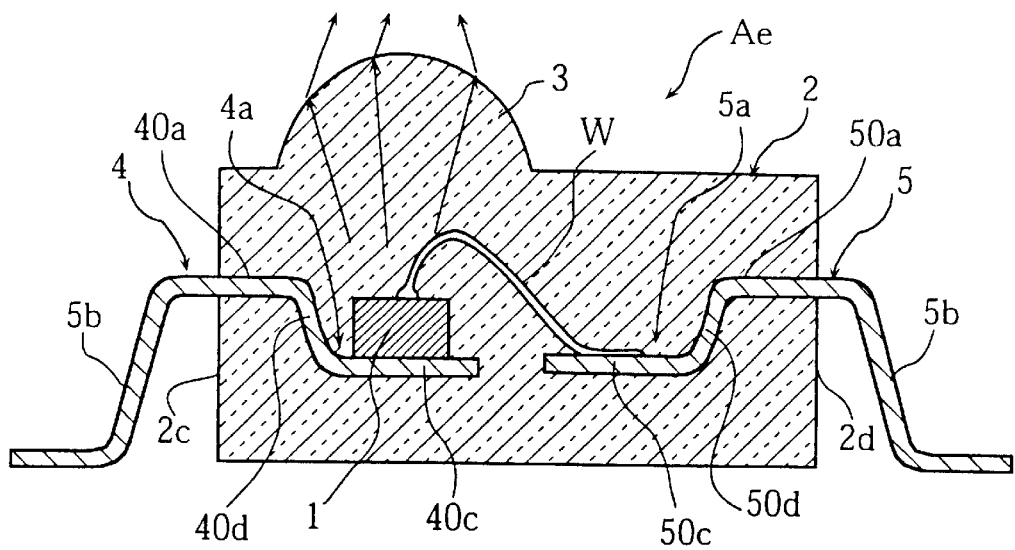
FIG. 13 is a sectional view taken in lines III—III in FIG. 11.
Figure 14:
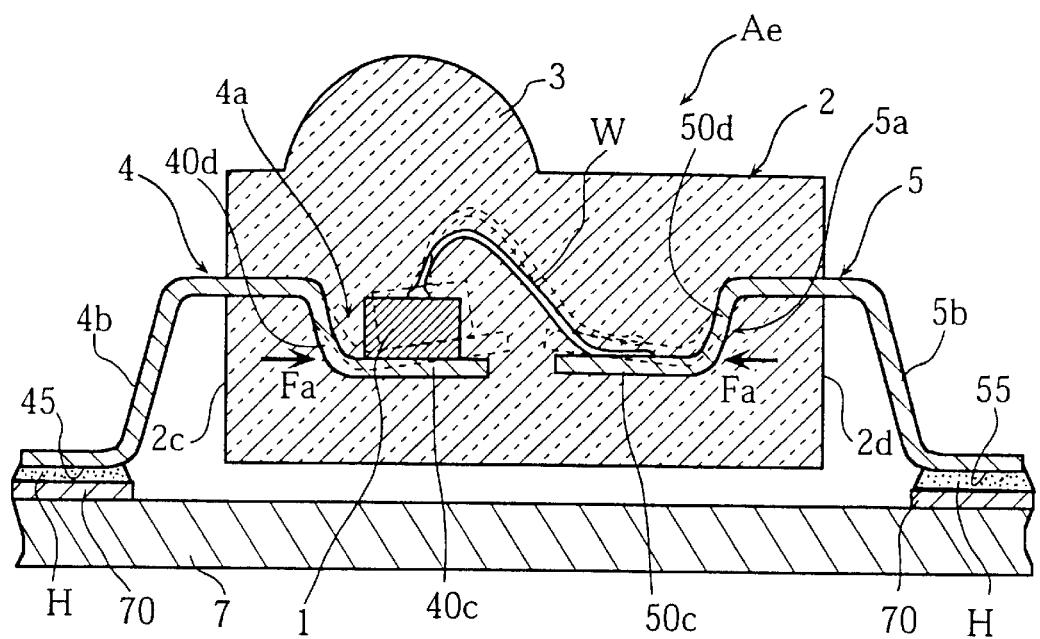
FIG. 14 is a sectional-view illustrating function of the semiconductor device according to the sixth embodiment.

FIG. 12 to FIG. 14 show a semiconductor device Ae according to a sixth embodiment of the present invention. According to the semiconductor device Ae, the first and the second inner terminals 4a, 5a are bent like a crank, so that the first and the second inner terminals 4a, 5a have intermediate portions represented by falling portions 40d 50d respectively. Thus, each of the horizontal portions, i.e. the horizontal portion 40c to which the light emitting element 1 is bonded and the horizontal portion 50c to which the second end portion is bonded, is disposed lower than the other horizontal portions 40a, 50a located near the first side surface 2c or the second side surface 2d of the resin package 2.

According to the semiconductor device Ae with the above arrangement, there is an advantage as shown clearly in FIG. 14. Specifically, at the time of mounting on the substrate 7 by means of the solder re-flow method, when the resin package 2 continues to shrink in the cooling step in which the solder paste H is allowed to cool after being re-melted, the falling portions 40d, 50d provide resistance against the shrinking. Therefore, following the same principle as described with reference to FIG. 6, it becomes possible to prevent the shrinking force of the resin package 2 from fully acting on the bonding portion of the first end portion of the wire W, as well as on the bonding portion of the second end portion of the wire W. Further, as emphatically illustrated in broken lines in FIG. 14, it also becomes possible to displace the horizontal portions 40c, 50c of the first and the second internal terminals 4a, 5a closer to each other by using the shrinking force F of the resin package 2. As a result, according to the semiconductor device Ae, the bonding portion at each end of the wire W becomes less susceptible to failure, providing a more preferable embodiment. Although the falling portions 40d, 50d are illustrated as slanted portions in the figure, these falling portions 40d, 50d may not necessarily be slanted but made perpendicular to the bottom surface 2b of the resin package 2. This also applies to rising portions 40e, 50e to be described later with reference to FIG. 16.

Figure 15:
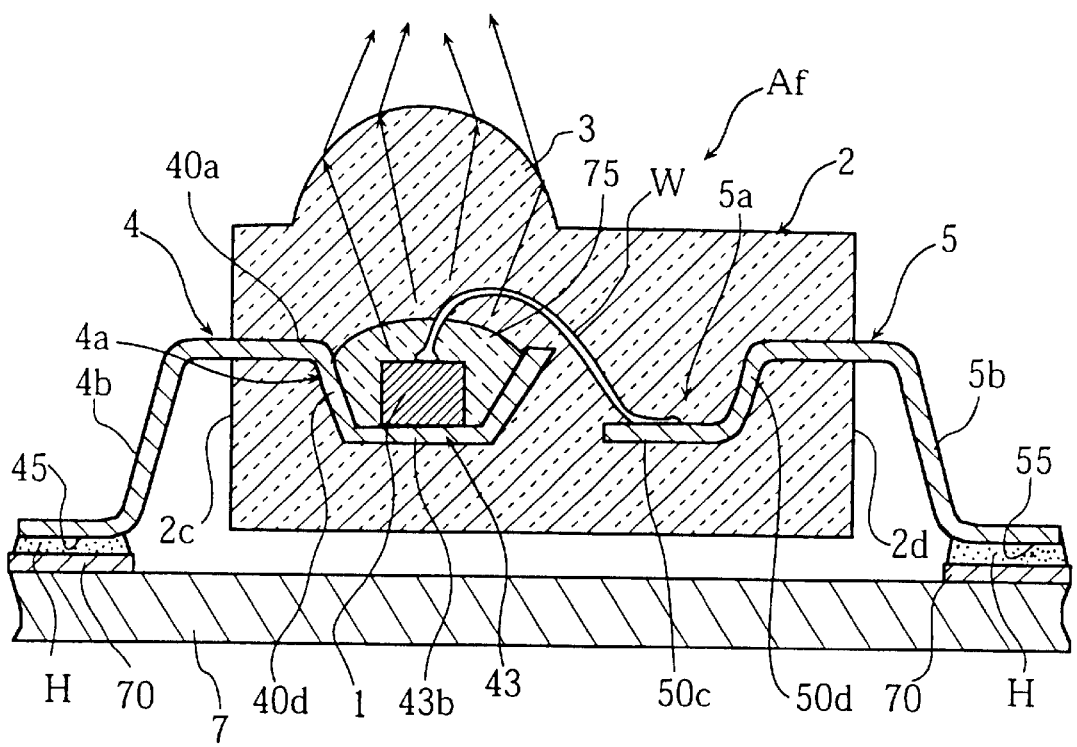
FIG. 15 is a sectional view of a semiconductor device according to a seventh embodiment of the present invention.

FIG. 15 shows a semiconductor device Af according to a seventh embodiment of the present invention. The semiconductor device Af differs from the above described semiconductor device Ae in that the first inner terminal 4a has a portion formed with a cup portion 43 having a bottom portion 43b to which the light emitting element 1 is bonded. The cup portion 43 is provided with the falling portion 40d which connects the horizontal portion 40a near the first side surface 2c of the resin package 2 with the bottom portion 43b of the cup portion 43 to which the light emitting element 1 is bonded.

According to the semiconductor device Af with the above arrangement, a basic pattern of bending made in the first and the second inner terminals 4a, 5a are common to that of the above described semiconductor device Ae. Therefore, the same effect as described for the semiconductor device Ae can be expected. Because of the provision of the cup portion 43, light radiation efficiency to a desired region can be increased by the light reflected on the recessed surface 43a of the cup portion 43. In addition, placement of the filling material 75 can be performed easily.

Figure 16:
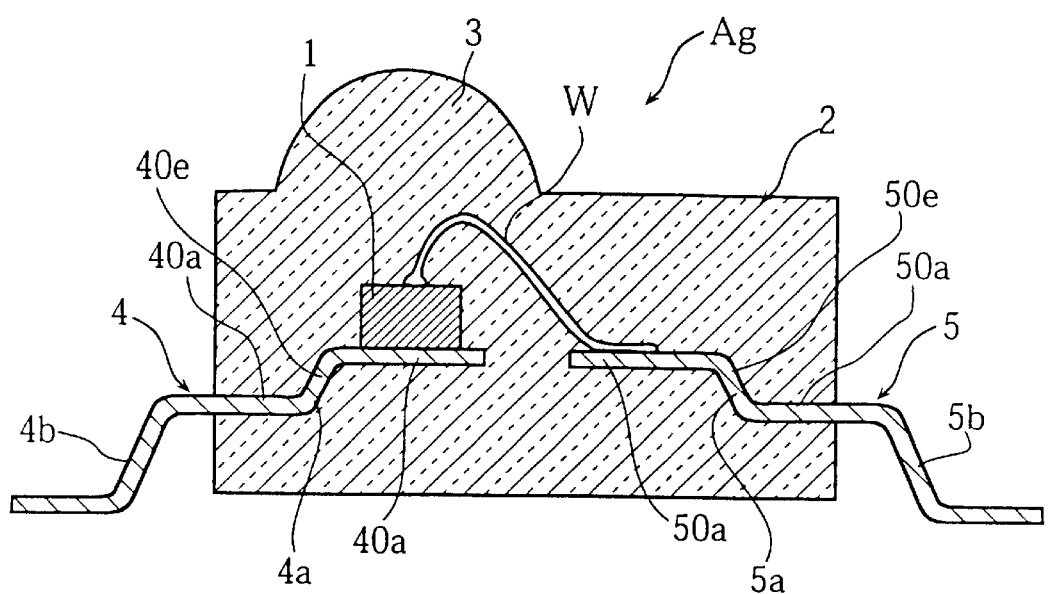
FIG. 16 is a sectional view of a semiconductor device according to an eighth embodiment of the present invention.

FIG. 16 shows a semiconductor device Ag according to an eighth embodiment of the present invention. According to the semiconductor device Ag, each the first and second inner terminals 4a, 5a is bent into like a crank, with directions of bending being opposite to the directions of bending in the first and the second inner terminals of the semiconductor device Ae. More specifically, the first and the second inner terminals 4a, 5a of this semiconductor device Ag have respective rising portions 40e, 50e extending upward from the horizontal portions 40a, 50a near the first and the second side surfaces 2c, 2d of the resin package 2. The rising portions 40e, 50e have respective horizontal portions 40c, 50c, to which the light emitting element 1 and the second end portion of the wire W are bonded respectively.

According to the semiconductor device Ae, the first and the second internal terminals 4a, 5a are bent in the opposite directions as in the semiconductor device Ae. However, in terms of the function of the first and the second inner terminals 4a, 5a, the same function as in the semiconductor device Ae can be expected. More specifically, when the resin package 2 continues to shrink in the mounting process of the semiconductor device Ag, the rising portions 40e, 50e provide resistance against the shrinking of the resin package 2. Further, it also becomes possible to rotate the horizontal portions 40c, 50c downward to come closer to each other by using the shrinking force of the resin package 2. Therefore, the bonding portion at each end of the wire W becomes less susceptible to failure.

Figure 17:
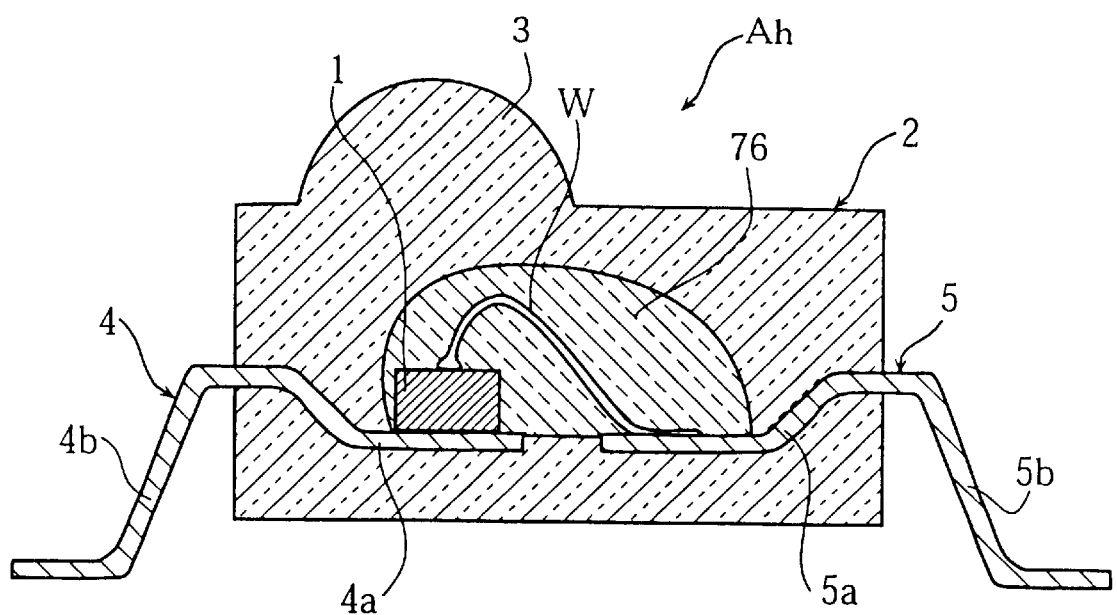
FIG. 17 is a sectional view of a semiconductor device according to a ninth embodiment of the present invention.
Figure 18:
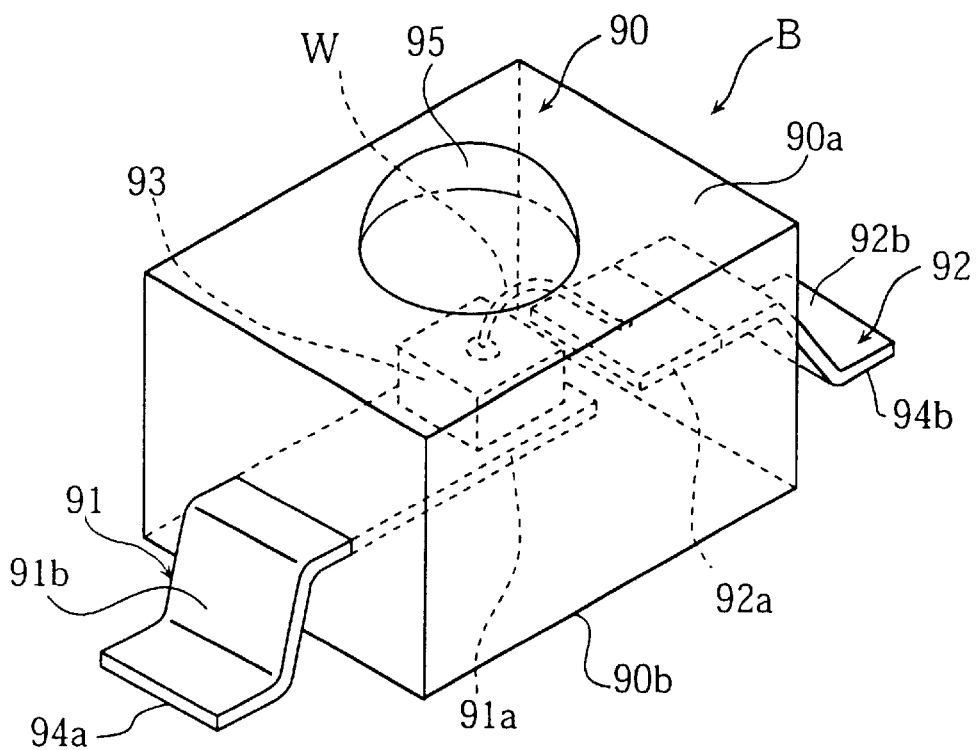
FIG. 18 is perspective view showing a prior art semiconductor device.
Figure 19:
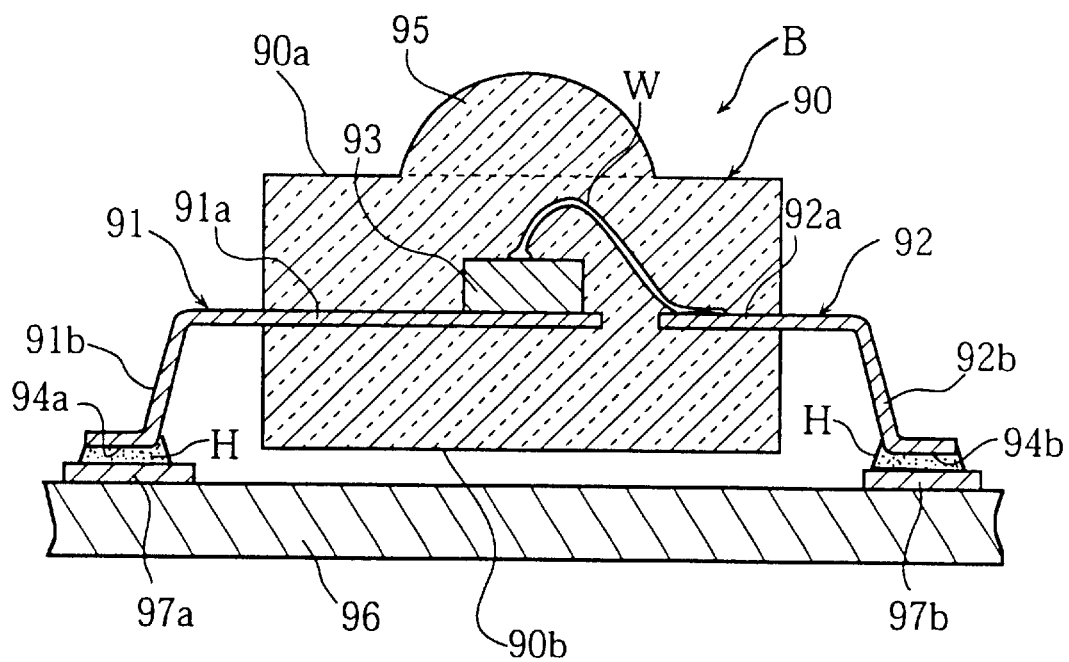
FIG. 19 is a sectional view illustrating function of the semiconductor device in FIG. 18.
Figure 20:
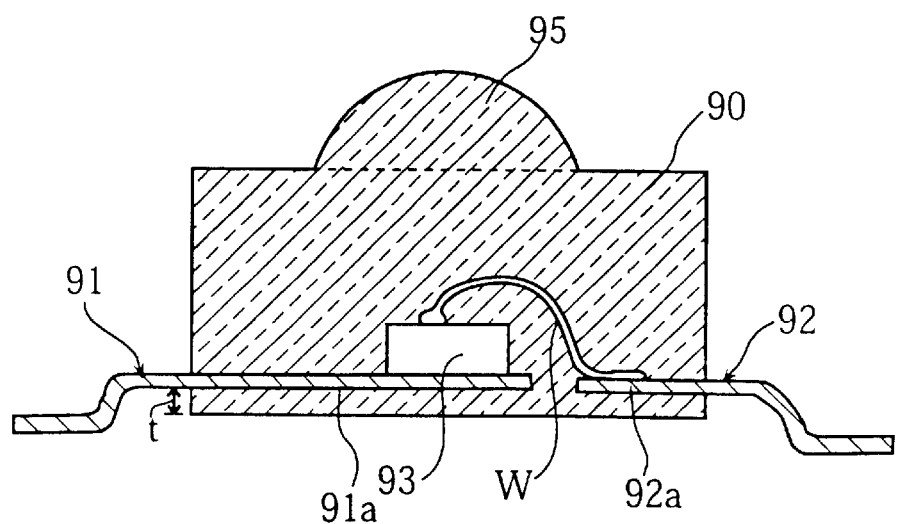
FIG. 20 is a sectional view showing a state in which a height of leads of the semiconductor device in FIG. 18 is altered.

FIG. 17 shows a semiconductor device Ah according to an eighth embodiment of the present invention. According to the semiconductor device Ah, inside of the resin package 2 is filled with a resin 76. The resin 76 entirely covers the light emitting element 1 and the wire W. The resin 76 can be a transparent silicone rubber for example, which assumes a softer state than is the heated resin package 2 at least in the process when the semiconductor device Ah is mounted on the substrate by means of the solder re-flow method.

According to the semiconductor device Ah, the shrinking force when the resin package 2 is thermally shrinking is received by the resin 76, thereby making possible to prevent the shrinking force from directly acting on portions of the light emitting element 1 and the wire W. Therefore, it becomes possible to further increase the failure prevention effect of the wire W.

Specific arrangements in the semiconductor device according to the present invention are not limited to the embodiments thus far described above, and can be varied in many ways.

As has been described earlier, according to the present invention, the light emitting element may be replaced by a light receiving element. In other words, the semiconductor device may be constituted as a light emitting device for emitting a light of a specific frequency range including a visible light and invisible light such as an infrared ray, or a light receiving device for receiving such a light as above. The resin package can be made of a resin which shields all the visible light allowing only an infrared ray for example. Further, if the light emitting element and the light receiving element are embedded in a single resin package with a space in between, the semiconductor device according to the present invention can be constituted as a photo-interrupter. The semiconductor chip may not necessarily be a light emitting element or a light receiving element of course. Further, according to the present invention, the first inner terminal onto which the semiconductor chip is bonded may not necessarily be bent. Alternatively, only the second inner terminal onto which the second end portion of the wire is bonded may by bent toward the thickness of the resin package.

What is claimed is:

1. A semiconductor optical device comprising:
   a resin package including an upper surface integrally provided with a convex lens portion, a bottom surface opposite to the upper surface, a first side surface and a second side surface opposite to the first side surface, the resin package being capable of transmitting light;
   a semiconductor optical chip sealed in the resin package;

a wire including a first end bonded to the semiconductor chip and a second end away from the first end;

a first lead including a bent first inner terminal cup entering from the first side surface into the resin package and a first outer terminal connecting to the first inner terminal cup and exposed to outside of the resin package, the semiconductor chip being bonded to the first inner terminal cup;

a second lead including a second inner terminal entering from the second side surface into the resin package and a second outer terminal connecting to the second inner terminal and exposed to outside of the resin package, the second end of the wire being bonded to the second inner terminal; and a covering member softer than the resin package and capable of transmitting the light;

wherein the first inner terminal cup is provided with a recessed surface surrounding the semiconductor chip and facing the lens portion of the resin package, the recessed surface including a bottom portion for supporting the semiconductor chip and a slanted reflective portion flaring toward the lens portion for reflecting the light, the covering member filling the cup for covering the semiconductor chip; and wherein the covering member bulges convexly above the first inner terminal cup toward the lens portion.

2. The semiconductor device according to claim 1, wherein the semiconductor optical chip provides a light emitting element or a light receiving element.

3. The semiconductor device according to claim 1, wherein the resin package is made of an epoxy resin.

4. The semiconductor device according to claim 1, wherein the second end of the wire includes a bonding portion fixed to the second inner terminal.

* * * * *